United States Patent
Caporizzo

[19]

[11] Patent Number: 6,013,876
[45] Date of Patent: Jan. 11, 2000

[54] METHOD AND DEVICE FOR ELECTRICALLY CONNECTING CIRCUITS TO OPPOSITE SURFACES OF A PRINTED CIRCUIT BOARD

[75] Inventor: Louis Caporizzo, North Wales, Pa.

[73] Assignee: General Instrument Corporation, Hatboro, Pa.

[21] Appl. No.: 09/012,216

[22] Filed: Jan. 23, 1998

[51] Int. Cl.[7] .................................................. H01R 9/09
[52] U.S. Cl. .......................... 174/262; 174/263; 174/264; 361/777; 29/844
[58] Field of Search ................................... 174/262, 263, 174/264; 361/777, 779, 748; 29/843, 844, 845, 883

[56] References Cited

U.S. PATENT DOCUMENTS

| | | | |
|---|---|---|---|
| 3,385,773 | 5/1968 | Frantzen | 205/125 |
| 4,383,363 | 5/1983 | Hayakawa et al. | 29/847 |
| 4,771,537 | 9/1988 | Pryor et al. | 29/830 |
| 4,982,376 | 1/1991 | Megans et al. | 361/760 |
| 5,030,800 | 7/1991 | Kawakami et al. | 174/264 |
| 5,552,107 | 9/1996 | Casey et al. | 419/13 |
| 5,786,238 | 7/1998 | Pai et al. | 438/118 |

FOREIGN PATENT DOCUMENTS

| | | | |
|---|---|---|---|
| 678537 | 1/1964 | Canada | 174/264 |
| 2086288 | 5/1982 | United Kingdom | 174/264 |

*Primary Examiner*—Kristine Kincaid
*Assistant Examiner*—Dhiru R Patel
*Attorney, Agent, or Firm*—Ronald P. Kananen; Rader, Fiahman & Grauer

[57] ABSTRACT

A device and method provide an easy and inexpensive electrical connection between circuits on both sides of a printed circuit board. A through-hole is formed in the board with conductive copper pads around the periphery of the hole on both sides of the circuit board. A malleable, conductive plug is inserted through the hole and then deformed. The plug has a length and diameter such that when deformed, it completely fills the hole and makes a solid electrical connection with the copper pads on both sides of the circuit board. Circuits on both sides of the circuit board may be electrically connected to each other through the copper pads and deformed plug.

18 Claims, 3 Drawing Sheets

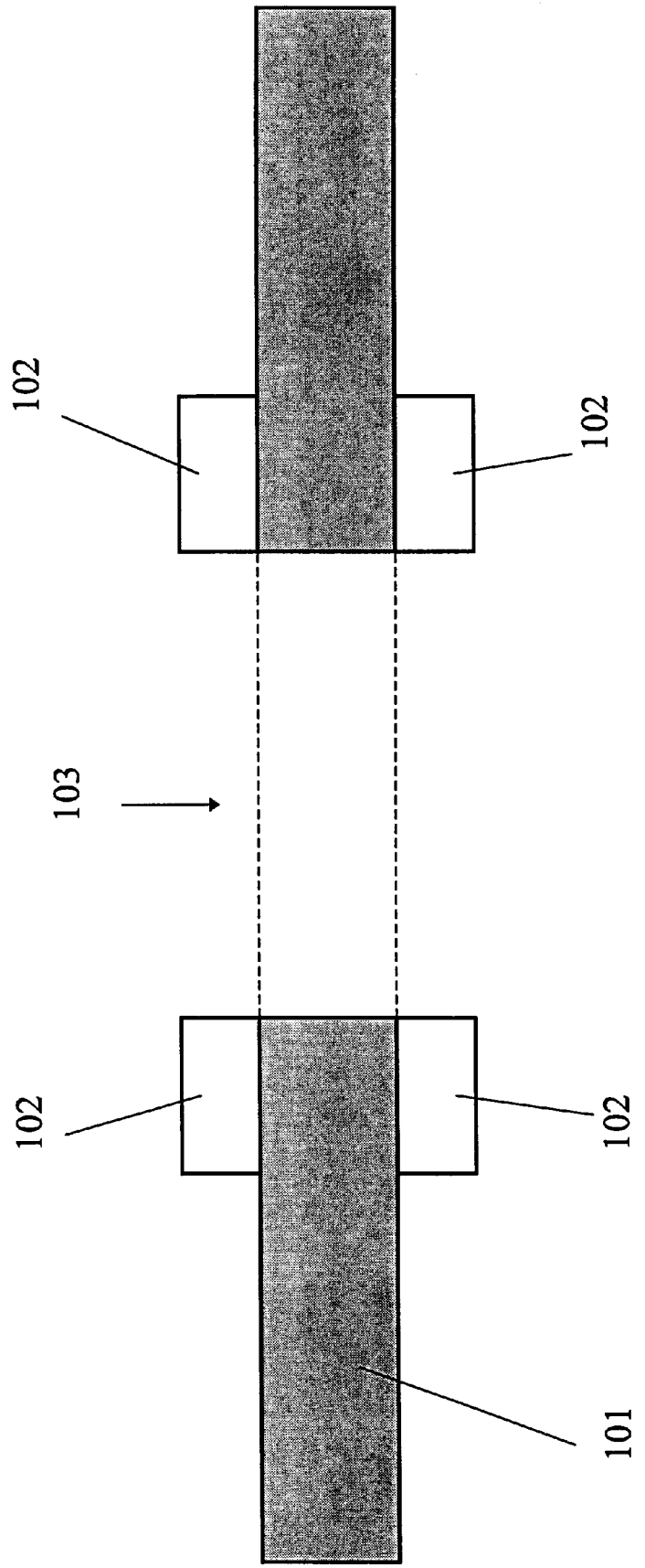

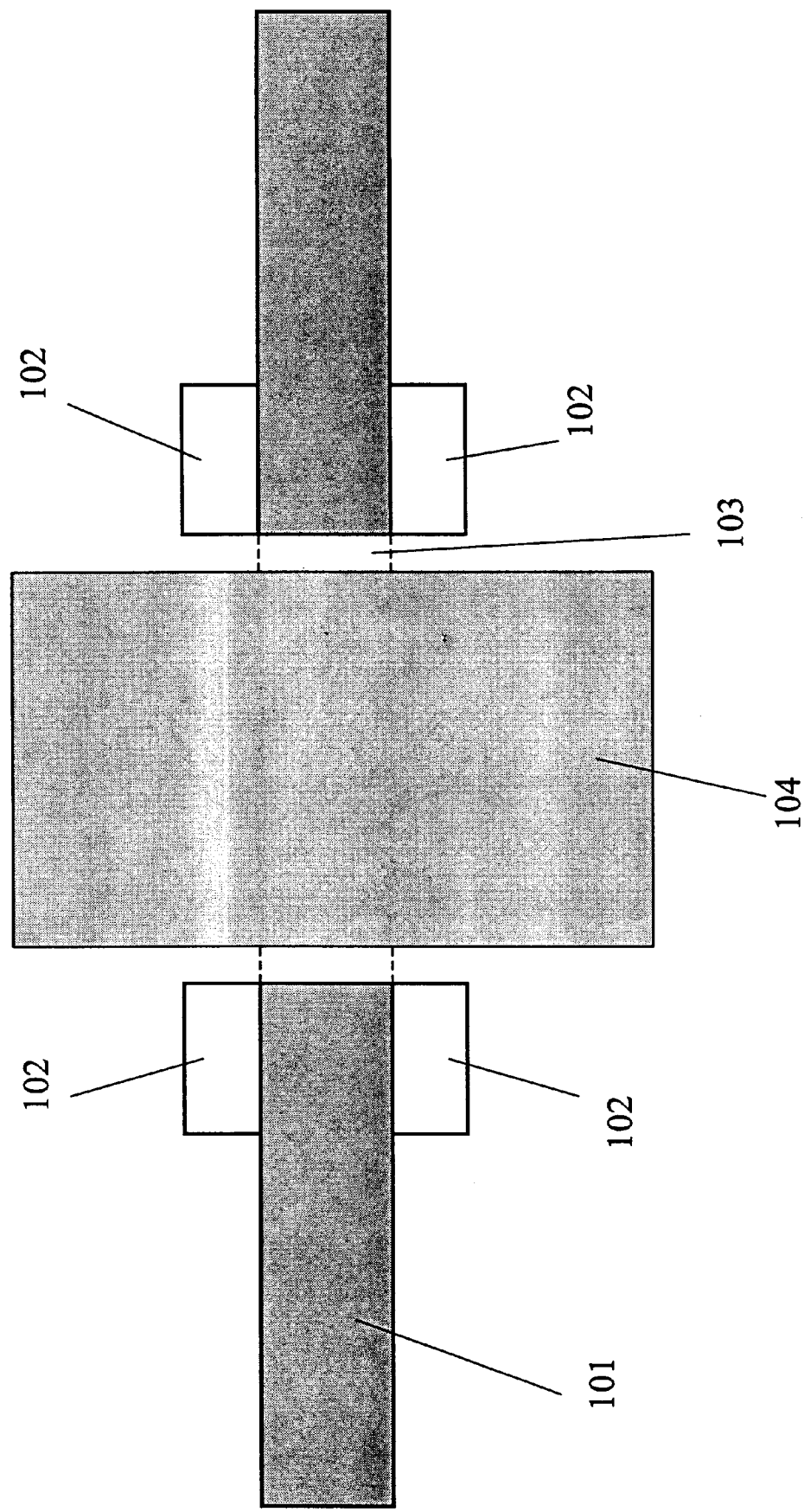

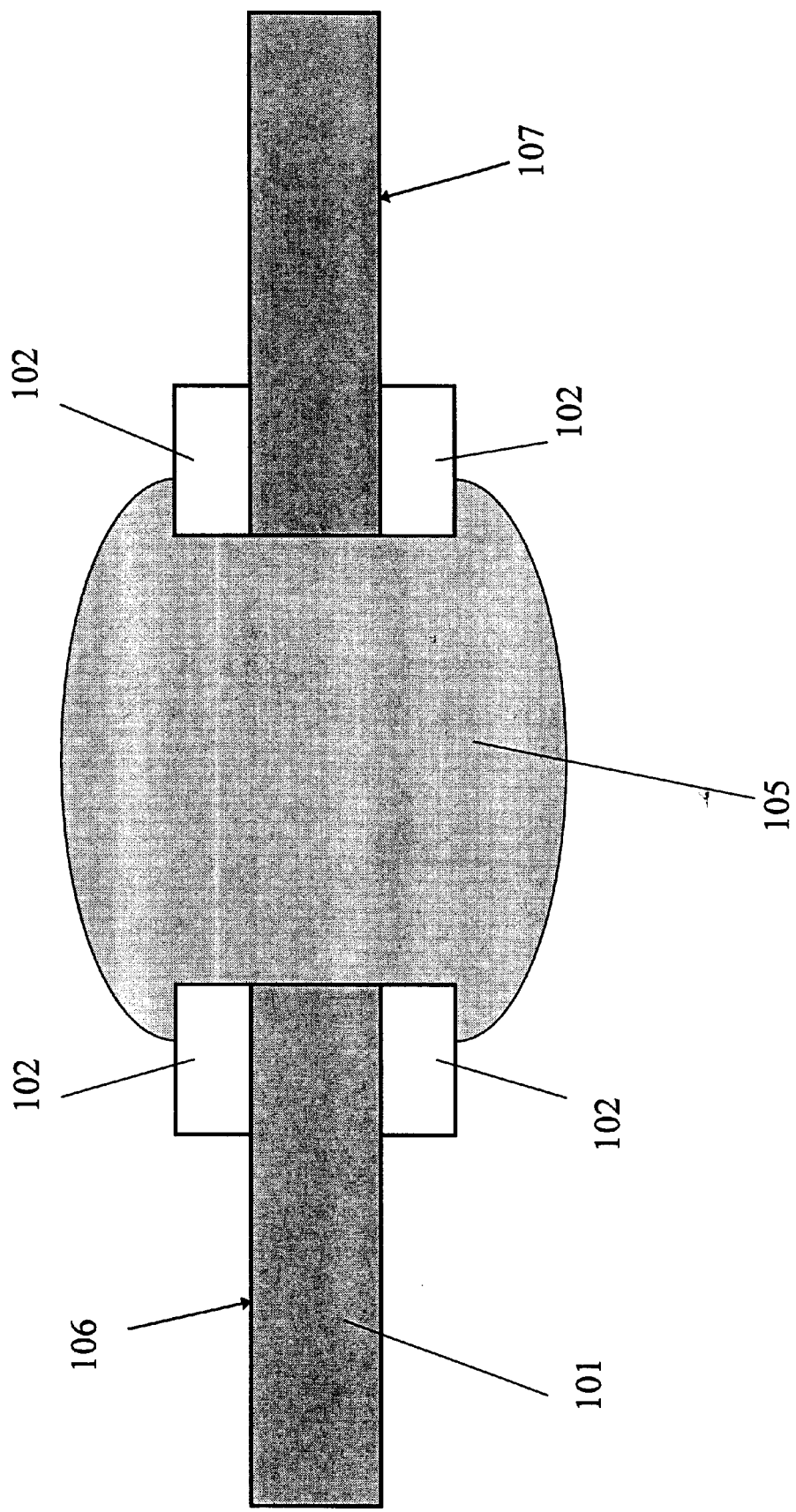

METHOD AND DEVICE FOR ELECTRICALLY CONNECTING CIRCUITS TO OPPOSITE SURFACES OF A PRINTED CIRCUIT BOARD

FIELD OF THE INVENTION

The present invention relates to a method and device for electrically connecting circuits on the two opposite side surfaces of a printed circuit board. More particularly, the present invention relates to a connection hole prepared in the printed circuit board, and a malleable, conductive metal plug used to plug that connection hole, thereby electrically connecting circuits on both surfaces of the printed circuit board.

BACKGROUND OF THE INVENTION

Electronic circuits are ubiquitous in modern society and may be found in such diverse applications as computers, combustion engines and toys. To reduce the size and cost of electronic circuits, modern technology has created the printed circuit board. A printed circuit board is a rigid board made of an insulating material, for example plastic, to which the elements of a circuit, for example capacitors, resistors, transistors, inductors, etc. are attached. Interconnections between the circuit elements are made by lines of conductive material that are "printed" on the board.

The printed circuit board allows a large number of circuits to be manufactured reliably and at low cost due to the fact that the intricate connections between circuit elements are already provided on the board. Moreover, the connections provided on the circuit board require less space than if the circuit elements were otherwise wired together, particularly if the circuit is fairly complex.

It may be realized that the reduction in required space provided by the printed circuit board could be increased if both sides of the printed circuit board are used. In other words, if the necessary electronic circuits are disposed, not just on the upper surface of the printed circuit board, but on both the upper and lower surfaces, the circuit board may be reduced in size by as much as half. Alternatively, more circuitry may be provided on a particular circuit board if both sides of the board are used to carry circuitry.

However, a problem arises in providing circuitry on both sides of the printed circuit board. This problem is the difficulty of easily and inexpensively connecting the circuits on the two opposite surfaces of the circuit board to each other. Connections between the two circuits may be needed at one, several or many points to provide the optimal design for the circuit as a whole.

In the past, such connections have been provided by forming plated through-holes in the printed circuit boards. However, this approach is time-consuming and costly.

Accordingly, there is a need in the art for a method and device that easily and inexpensively provides a reliable electrical connection between circuits on two opposite surfaces of a printed circuit board.

SUMMARY OF THE INVENTION

It is an object of the present invention to meet the above-described needs and others. Specifically, it is an object of the present invention to provide a method and device for providing an inexpensive and reliable electrical connection between circuits on two opposite sides of a circuit board.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve the stated and other objects of the present invention, as embodied and described below, the invention may include a method of providing an electrical connection between first and second sides of a circuit board by deforming a malleable conductor in a through-hole of the circuit board such that the deformed conductor electrically contacts conductive pads on both the first and second sides of the circuit board.

Preferably, the deforming of the conductor causes the conductor to completely fill the through-hole. The deforming of the conductor may be performed mechanically or by infrared reflow soldering or wave soldering.

Preferably, the method includes providing copper pads as the conductive pads. The method of the present invention uses the conductive pads by connecting a first circuit on the first side of the circuit board to one of the conductive pads on the first side of the circuit board; and connecting a second circuit on the second side of the circuit board to one of the conductive pads on the second side of the circuit board.

To better effect the connection between the conductor and the conductive pads, the method preferably includes forming the conductive pads on a periphery of the through-hole prior to the deforming of the conductor.

The present invention also encompasses a device for electrically connecting first and second sides of a circuit board including: a circuit board having a through-hole formed therein; conductive pads on first and second sides of the circuit board; and a conductor extending through the through-hole and providing an electrical connection between the conductive pads on the first and second sides of the circuit board. Preferably, the through-hole has a circular cross-section, and the conductor completely fills the through-hole. Also, the conductive pads are preferably made of copper and formed on the periphery of the through-hole. The conductor may be made of a soft metal, for example aluminum, copper or solder.

With the conductor in place, a circuit on the first side of the circuit board may be electrically connected to one of the conductive pads on the first side of the circuit board, and a second circuit on the second side of the circuit board may be electrically connected to one of the conductive pads on the second side of the circuit board. In this way, an electrical interconnection between the first and second circuits is made. At least one of the first and second circuits may be a printed circuit printed on the circuit board.

BRIEF DESCRIPTION OF THE DRAWINGS

The accompanying drawings illustrate the present invention and are a part of the specification. Together with the following description, the drawings demonstrate and explain the principles of the present invention.

FIG. 1 illustrates a circuit board according to the present invention which is prepared to receive an electrical connection between the upper and lower surfaces of the board.

FIG. 2 illustrates the circuit board of FIG. 1 in which an electrical connection between the upper and lower surfaces of the board is being made according to the present invention.

FIG. 3 illustrates an electrical connection according to the present invention between the upper and lower surfaces of the circuit board of FIGS. 1 and 2.

DETAILED DESCRIPTION OF THE PREFERRED EMBODIMENTS

Using the drawings, the preferred embodiments of the present invention will now be explained.

As shown in FIG. 1, the present invention may be implemented using a printed circuit board 101 through which a hole 103 has been made. Around the periphery of the hole 103, copper pads 102 are provided. Circuitry provided on the upper and lower surfaces of the printed circuit board 101 can be connected to the copper pads 102, which in turn are used to form the electrical connection to the opposite side of the printed circuit board 101 according to the present invention.

As shown in FIG. 2, a wire plug 104 is inserted into the through-hole 103. The plug 104 is made of a highly malleable material which is also electrically conductive. Metal, e.g. aluminum, copper or solder, may be used to form the plug 104. Preferably, the plug 104 is long enough and thick enough that it can be deformed to completely fill the through-hole 103 and make solid electrical connections with the copper pads 102.

As shown in FIG. 3, the former plug 104 is deformed into an electrical connector 105 which fills the through-hole 103 and makes solid electrical connections between the copper pads 102 on the upper 106 and lower 107 surfaces of the printed circuit board 101. Circuits on the upper 106 and lower 107 surfaces of the printed circuit 101 can thus be electrically connected through a copper pad 102 on the relevant sides of the board 101, the deformed plug 105 and a copper pad 102 on the opposite side of the board.

The plug 104 may be deformed into connector 105 by any of several techniques. Preferably, the plug 104 is mechanically deformed into connector 105 by applying force at the ends of the plug 104. Plug 104 may also be deformed into connector 105 by such techniques as infrared reflow or wave soldering. These techniques allow an easy and inexpensive electrical connection between the circuits on both sides of the printed circuit board 101 to be provided through mass production.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A method of providing an electrical connection between first and second sides of a circuit board comprising deforming a malleable conductor in a through-hole of said circuit board such that said deformed conductor electrically contacts conductive pads on both said first and second sides of said circuit board.

2. A method as claimed in claim 1, wherein said deforming further comprises deforming said conductor to completely fill said through-hole.

3. A method as claimed in claim 1, wherein said deforming further comprises deforming said conductor by IR reflow soldering.

4. A method as claimed in claim 1, wherein said deforming further comprises deforming said conductor by wave soldering.

5. A method as claimed in claim 1, wherein said deforming further comprises mechanically deforming said conductor.

6. A method as claimed in claim 1, further comprising providing copper pads as said conductive pads.

7. A method as claimed in claim 1 further comprising:

connecting a first circuit on said first side of said circuit board to one of said conductive pads on said first side of said circuit board; and connecting a second circuit on said second side of said circuit board to one of said conductive pads on said second side of said circuit board.

8. A method as claimed in claim 1, further comprising: forming said conductive pads on a periphery of said through-hole prior to said deforming.

9. A device for electrically connecting first and second sides of a circuit board comprising:

a circuit board having a through-hole formed therein; and a metal plug extending through said through-hole having opposite ends which are each deformed into physical contact with conductive pads on said first and second sides of said circuit board to provide an electrical connection between said conductive pads on said first and said second sides of said circuit board.

10. A device as claimed in claim 9, wherein said conductor completely fills said through-hole.

11. A device as claimed in claim 9, further comprising:

a first circuit on said first side of said circuit board, said first circuit being electrically connected to one of said conductive pads on said first side of said circuit board; and a second circuit on said second side of said circuit board, said second circuit being electrically connected to one of said conductive pads on said second side of said circuit board.

12. A device as claimed in claim 11, wherein at least one of said first and second circuits is a printed circuit printed on said circuit board.

13. A device as claimed in claim 9 wherein said conductive pads are copper.

14. A device as claimed in claim 9, wherein said conductor is aluminum, copper or solder.

15. A device as claimed in claim 9, wherein conductive pads are disposed on a periphery of said through-hole.

16. A device as claimed in claim 9, wherein said through-hole has a circular cross-section.

17. A device as claimed in claim 9, wherein said metal plug has a rectangular vertical cross section.

18. A device as claimed in claim 9, wherein said metal plug is made of a solid material so as to maintain said electrical connection between said conductive pads when mechanically deformed.

* * * * *